United States Patent [19]
Toyoda

[11] 4,061,431
[45] Dec. 6, 1977

[54] LIGHT MEASURING AND INDICATING CIRCUIT

[75] Inventor: Kenji Toyoda, Kawasaki, Japan

[73] Assignee: Nippon Kogaku K.K., Tokyo, Japan

[21] Appl. No.: 628,654

[22] Filed: Nov. 4, 1975

[30] Foreign Application Priority Data
Nov. 20, 1974 Japan .................................. 49-132790

[51] Int. Cl.² .......................... G01J 1/42; G03B 7/08
[52] U.S. Cl. ................................ 356/227; 250/214 P; 354/23 D; 356/226
[58] Field of Search ............. 356/227, 226; 354/23 D; 328/2; 250/214 P; 340/324 R

[56] References Cited
U.S. PATENT DOCUMENTS

| | | | |
|---|---|---|---|
| 3,724,955 | 4/1973 | Takahashi et al. | 356/227 |
| 3,836,262 | 9/1974 | Yata et al. | 356/226 |
| 3,895,875 | 7/1975 | Kitaura et al. | 356/226 |
| 3,899,788 | 8/1975 | Toyoda | 356/226 |
| 3,959,791 | 5/1976 | Takahashi et al. | 340/324 R |
| 3,990,799 | 11/1976 | Nanba et al. | 356/226 |

*Primary Examiner*—John K. Corbin
*Assistant Examiner*—Stewart Levy
*Attorney, Agent, or Firm*—Shapiro and Shapiro

[57] ABSTRACT

A light measuring and indicating circuit utilizing indicating elements such as light-emitting diodes, to indicate corresponding light intensity levels. Intermediate levels are indicated without increasing the number of flip-flops employed in an activating circuit for the light-emitting diodes by intentionally causing the circuit to activate light-emitting diodes alternately. The activating circuit includes a reversible digital counter controlling the light-emitting diodes, two comparators for operating the counter reversibly in response to the comparison of light-dependent and standard signals, and a digital-to-analog converter which varies one or more of said signals in accordance with a counter output.

21 Claims, 6 Drawing Figures

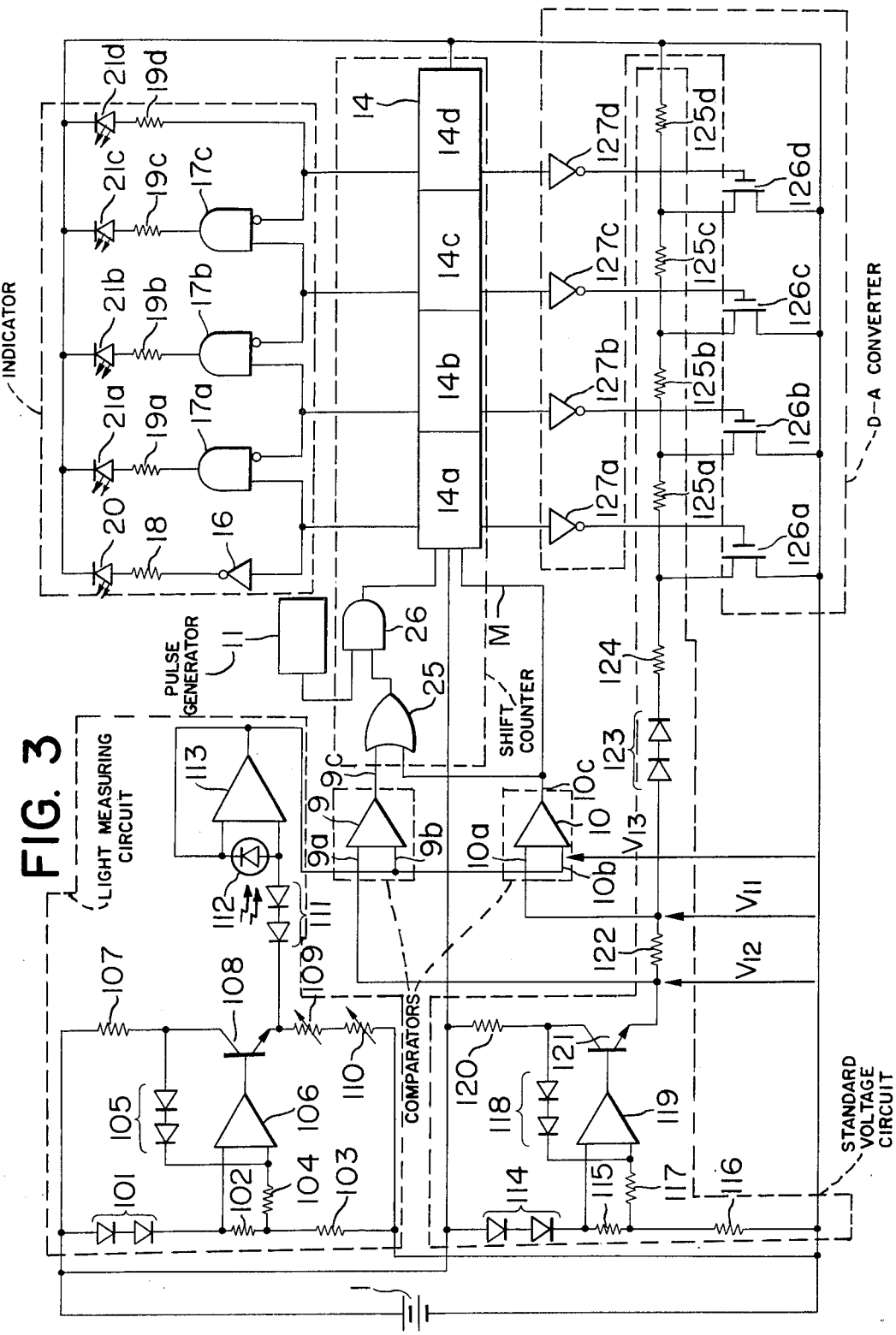

LIGHT MEASURING AND INDICATING CIRCUIT

BACKGROUND OF THE INVENTION

1. Field of the Invention

The present invention relates to a circuit for measuring and indicating the intensity of light adapted for use in an exposure meter.

2. Description of the Prior Art

For use in the exposure meter in a camera, there have been proposed several devices wherein the output electric signal of a light measuring circuit utilizing a photoelectric element is divided into plural levels and corresponding indicating elements such as light-emitting diodes are selectively lighted corresponding to said levels thereby indicating the adequacy of exposure, or in case of automatic exposure-controlled cameras, the lens aperture or shutter speed to be controlled.

In such devices, in order to indicate as much information as possible with a limited number of indicating elements, there is already known the following method. A light measuring and indicating circuit has $n$ indicating elements and indicates $(2n-1)$ levels or information by actuating $m$-th indicating element in accordance with $m$-th output level of the circuit, $(m + 1)$—th indicating element in accordance with $(m + 1)$-th output level, and both the $m$-th and $(m + 1)$-th indicating elements in accordance with the intermediate level between the $m$-th and $(m + 1)$-th levels.

Still in this method, however, there is required in the circuit for dividing the output signal of light-measuring circuit into plural levels (hereinafter called quatumizing circuit) a plurality of comparison switching circuits or flip-flops for every bit of a counter, of which the number corresponds to the number of said levels. For example a method disclosed in Japanese Laid-open patent application No. 91641/1974 requires at least $(2n - 2)$ comparison switching circuits in order to indicate $(2n - 1)$ levels with $n$ indicating elements, while a method disclosed in U.S. Pat. No. 3,703,130 requires, in order to indicate 15 levels with 8 indicating elements for example, 4 flip-flops in combination with a binary counter or 15 flip-flops in combination with a shift counter using a shift register.

SUMMARY OF THE INVENTION

An object of the present invention is to enable, a light measuring and indicating circuit utilizing indicating elements such a light-emitting diodes to indicate intermediate light-intensity levels without increasing the number of flip-flops employed in an activating circuit for the light-emitting diodes. This is accomplished by intentionally causing an oscillation in said circuit when the output of a light measuring circuit corresponds to an intermediate level.

BRIEF DESCRIPTION OF THE DRAWINGS

FIG. 3 is a circuit drawing of a second embodiment of the present invention;

DESCRIPTION OF THE PREFERRED EMBODIMENTS

Figure 1:
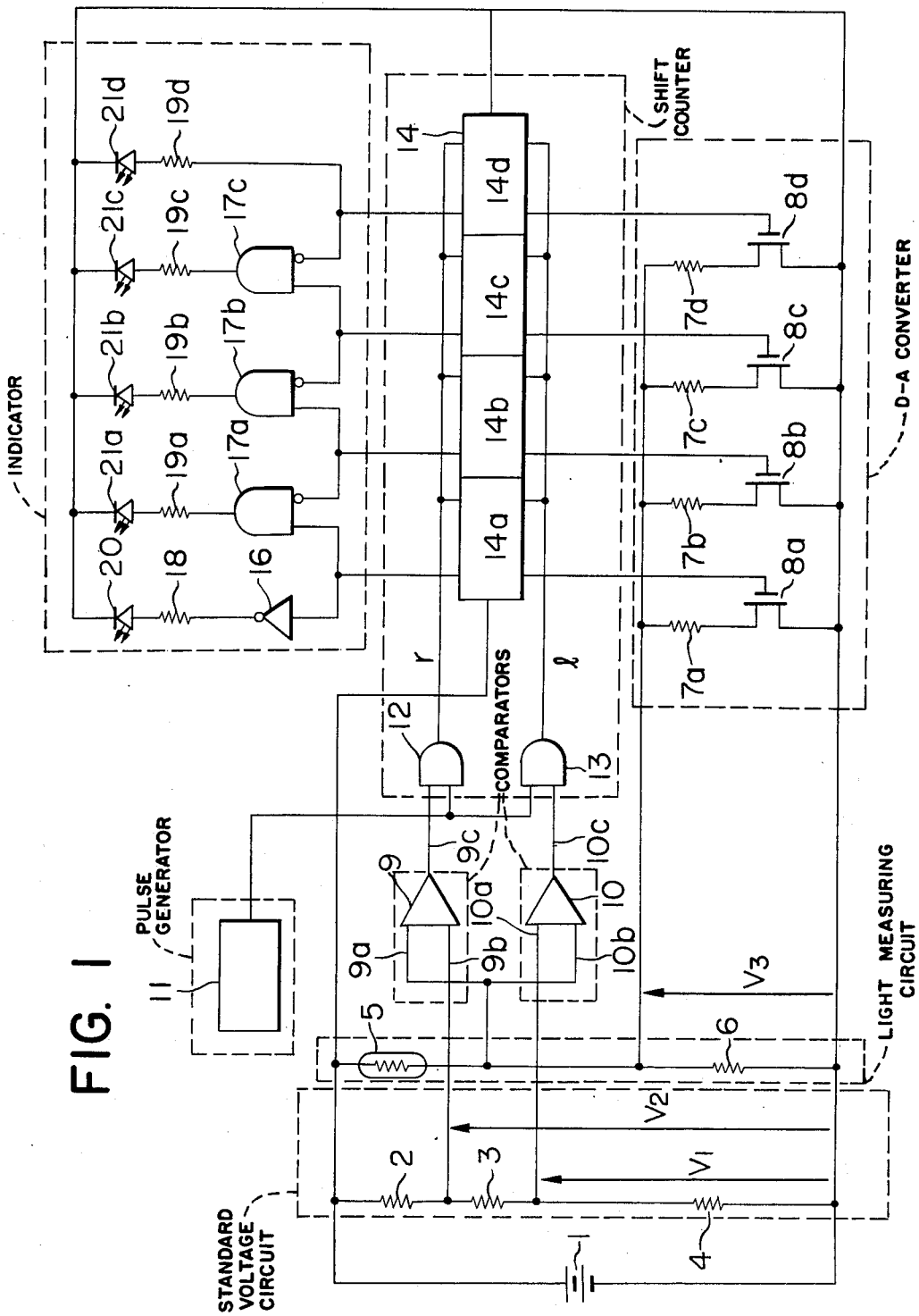
FIG. 1 is a circuit drawing of a first embodiment of the present invention.

With respect to FIG. 1 showing an embodiment of the present invention, fixed resistors 2, 3 and 4, of which values are in detail explained later, are connected in series between the terminals of a power source 1. A photoconductive element 5, such as a CdS element, is connected at an end thereof with the positive terminal of said power source 1 and at the other end thereof with the negative terminal of said power source through a fixed resistor 6. Fixed resistors 7a, 7b, 7c and 7d of the values explained later are connected at one ends thereof respective with the connecting point between said photoconductive element 5 and said fixed resistor 6, and at the other ends thereof with the negative terminal of said power source 1 respectively through field-effect transistors(hereinafter expressed as FET) 8a, 8b, 8c and 8d used as analog switches. A digital-analog converting means is thus composed of said fixed resistors 7a, 7b, 7c and 7d and said analog switching FET's 8a, 8b, 8c and 8d for producing an analog output from a counter, later described. There is provided a comprising circuit 9 of which an input terminal 9a is connected with the connecting point between said photoconductive element 5 and said resistor 6 while the other input terminal 9b is connected with the connecting point between said resistors 2 and 3, and which is designed to generate at the output terminal 9c thereof either a high-level voltage (hereinafter expressed as voltage H) when the voltage at said input terminal 9a is higher than that at said input terminal 9b or a lower-level voltage (hereinafter expressed as voltage L) in other cases. Another comparing circuit 10 of which an input terminal 10a is connected with the connecting point between said resistors 3 and 4 while the other input terminal 10b is connected to the connecting point between said photoconductive element 5 and said resistor 6 also generates at the output terminal 10c thereof a voltage H in case the voltage at said input terminal 10a is higher than that at said input terminal 10b or a voltage L in other cases. A conventional pulse generator 11 generates pulses of a determined frequency. There is provided a reversible digital counter means which is composed of 'AND' gates 12 and 13, and a reversible shift counter 14. Said 'AND' gate 12 of which two input terminals are respectively connected with said pulse generator 11 and said output terminal 9c of the comprising circuit 9 passes the pulses from said pulse generator 11 when said output terminal 9c generate a voltage H and interrupts said pulses in the other case. Also said 'AND' gate 13 of which two input terminals are respectively connected to said pulse generator 11 and said output terminal 10c of the comparing circuit 10 passes the pulses from said pulse generator 11 when said output terminal 10c generates a voltage H and interrupts said pulses in the other case. Said shaft counter 14 is a right-left shift register consisting of four stages, flip-flops 14a, 14b, 14c and 14d. Said shift counter 14 is provided with two input terminals $l$ and $r$ for clock pulses, of which the terminal $l$ is connected with said 'AND' gate circuit 13 and functions, upon receipt of clock pulses therefrom, to shift the counter of each bit of shift counter to the left. For example when the flip-flops 14a, 14b, 14c and 14d are all in the state "H", a pulse supplied to said input terminal $l$ changes the flip-flop 14d to a state "L" as the serial input thereof is connected with the negative terminal of power source, while other flip-flops 14a, 14b and 14c retain the state "H". A further pulse supplied in this state changes the flip-flops 14c and 14d to "L" while the flip-flop 14a and 14b retaining the state "H", and in this manner the state "L" is successively shifted in the direction from 14d to 14a at each pulse supplied to said input terminal l. The other input terminal r is connected with said 'AND' gate circuit 12 and functions, upon receipt to clock pulses therefrom, to shift the contents of each bit of shift counter to the right. Stated otherwise the flip-flops are successively changed to a state "H" in the order of 14a, 14b, 14c and 14d upon receipt of each clock pulse as the serial input of the flip-flop 14a is connected with the positive terminal of power source. The shift counter 14 is provided with output terminals, two for each bit, one being connected respectively with the gates of said FET's 8a, 8b, 8c and 8d, while the other being connected with an inverter 16 and inhibit gate circuits 17a, 17b and 17c. There are provided plural light-emitting diodes (hereinafter expressed as LED) 20, 21a, 21b, 21c and 21d arranged in the finder of a camera, of which cathode terminals are commonly connected to the negative terminal of power source, while the anode terminal of said LED 20 is connected to said inverter 16 through a protecting resistor 18, that of LED 21a to the inhibit gate circuit 17a through a protecting circuit 19a, that of LED 21b to the inhibit gate circuit 17b through a protecting resistor 19b, that of LED 21c to the inhibit gate circuit 17c through a protecting circuit 19c and that of LED 21d to the output terminal of flip-flop 14d through a protecting resistor 19d. The shift counter 14, inverter 16, inhibit gate circuits 17a, 17b and 17c protecting resistors 18, 19a, 19b and 19c, LED's 20, 21a, 21b, 21c and 21d, and FET's 8a, 8b, 8c and 8d are designed to satisfy the mutual relationship shown in the following Table 1.

Table 1

| State of shift counter | | | | LED O ...lighted X ...extinguished | | | | | FET | | | | R |
|---|---|---|---|---|---|---|---|---|---|---|---|---|---|
| 14a | 14b | 14c | 14d | 20 | 21a | 21b | 21c | 21d | 8a | 8b | 8c | 8d | |
| L | L | L | L | O | X | X | X | X | OFF | OFF | OFF | OFF | $R_0$ |
| H | L | L | L | X | O | X | X | X | ON | OFF | OFF | OFF | $R_0/\sqrt{2}$ |
| H | H | L | L | X | X | O | X | X | ON | ON | OFF | OFF | $R_0/2$ |
| H | H | H | L | X | X | X | O | X | ON | ON | ON | OFF | $R_0/2\sqrt{2}$ |
| H | H | H | H | X | X | X | X | O | ON | ON | ON | ON | $R_0/4$ |

The values of fixed resistors 6, 7a, 7b, 7c and 7d can be determined in the following manner. Assuming that the gamma value of said photoconductive element 5 is equal to 0.5 and the value of fixed resistor 6 is $R_0$, the values $R_a$, $R_b$, $R_c$ and $R_d$ of the resistors 7a, 7b, 7c and 7d respectively are given by the following equations:

$$R_a = R_0 / (\sqrt{2} - 1)$$

$$R_b = R_0 / (2 - \sqrt{2})$$

$$R_c = R_0 / (2\sqrt{2} - 2)$$

$$R_d = R_0 / (4 - 2\sqrt{2})$$

In this manner, in each state represented in Table 1, the synthesized resistance R between the connecting point between said photoconductive elememt 5 and said fixed resistor 6 and the negative terminal of power source assumes the values shown in the righthand column of Table 1, thus showing a change in resistance by 1 EV for each state change.

As to the fixed resistors 2, 3 and 4, the values $R_2$, $R_3$ and $R_4$ thereof are determined in such a manner that the difference between the inverting level of said comparing circuit 10 and that of said comparing circuit 9 is equal to ½ EV. This can be achieved by determining said values according to the following equation:

$$R_2 : R_3 : R_4 = 1 : (\sqrt[8]{2} - 1) : 1$$

With resistors thus determined, the potential $V_1$ (a standard signal) at the connecting point between the fixed resistors 3 and 4 can be represented by the following equation:

$$V_1 = \frac{1}{1 + \sqrt[8]{2}} E$$

while the potential $V_2$ (a standard signal) at the connecting point between the fixed resistor 2 and 3 can be represented by the following equation:

$$V_2 = \frac{\sqrt[8]{2}}{1 + \sqrt[8]{2}} E$$

wherein E is the voltage of power source 1.

Figure 2A:
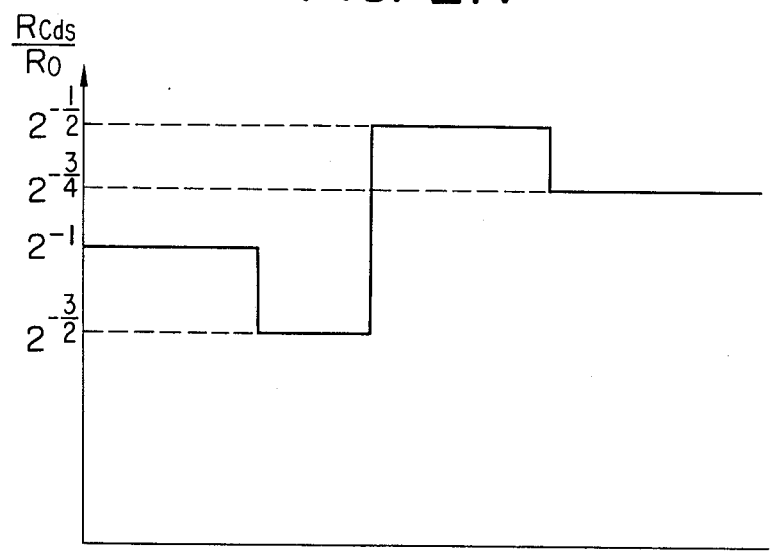
FIGS. 2A and 2B show the behavior of voltage in the first embodiment shown in FIG. 1.
Figure 2B:
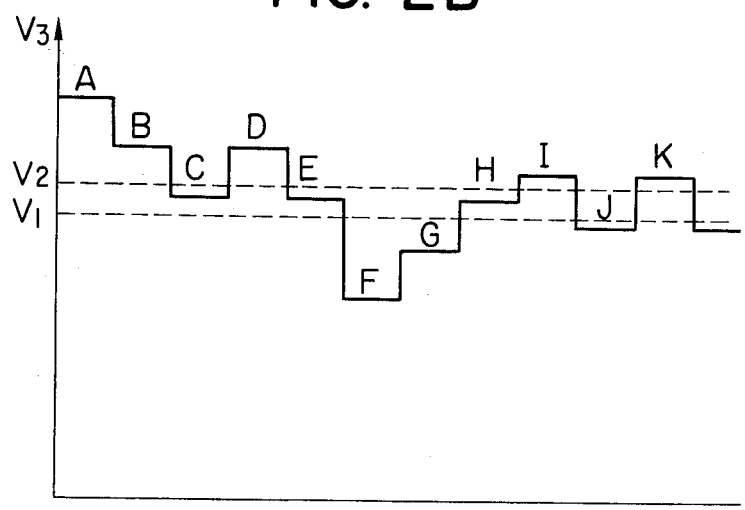

The function of the circuit of the embodiment shown in FIG. 1 is represented in the graphs of FIGS. 2A and 2B, wherein FIG. 2A represents the behavior of value of resistance $R_c$ of the photoconductive element 5 divided by $R_0$ in ordinate against time in abscissa, while FIG. 2B represents the behavior of potential at the connecting point between the photoconductive element 5 and fixed resistor 6 which is identical with the output voltage $V_3$ (a light-dependent signal) of the light measuring circuit in ordinate against time in abscissa. It is assumed as an initial state that all of the outputs of bits 14a, 14b, 14c and 14d of the shift counter 14 are in a state "L", and the resistance $R_c$ of the photoconductive element 5 is equal to $R_0/2$. In this state according to Table 1, the LED 20 is lighted, and all the FET's 8a, 8b, 8c and 8d are in "off" state. Thus the synthesized resistance R is equal to the value $R_0$ of resistor 6. Consequently, the output voltage $V_3$ of the light measuring circuit (i.e., the ampitude of the light-dependent signal) is equal to 2E/3, as indicated by A in FIG. 2B. Since in this state the output voltage $V_3$ of the light measuring circuit has a value higher than the values of the standard voltage $V_1$ and $V_2$, the comparing circuits 9 and 10 respectively generate outputs H and L, thus opening the 'AND' gate 12 and closing the 'AND' gate 13, enabling the pulses from the pulse generator 11 to enter the intput terminal r of shift counter 14 through said 'AND' gate 12. Upon receipt of the first pulse, the flip-flop 14a shifts to the state "H", thereby extinguishing the LED 20, lighting the LED 21a and shifting the FET 8a to conductive namely "on" state as shown in Table 1. Consequently, the synthesized resistance R assumes a value $R_0/\sqrt{2}$ and the output voltage $V_3$ of the light measuring circuit becomes $2E/(\sqrt{2} + 2)$, as represented by B in FIG. 2B. As the output voltage $V_3$ of the light measuring circuit is still in this state higher than the standard voltages $V_1$ and $V_2$, the comparing circuits 9 and 10 retain the states explained above, thus maintaining said 'AND' gate 12 open to allow entry of further pulses from the pulse generator 11 to the input terminal $r$ of the shift counter 14. Upon receipt of an additional pulse, the flip-flops 14a and 14d assume the state "H", thereby extinguishing the LED 21a, lighting instead the LED 21b and shifting the FET's 8a and 8b to "on" state, according to Tab. 1. In this state, the synthesized resistance R assumes a value $R_0/2$, and the output voltage $V_3$ of the light measuring circuit becomes $E/2$ as represented by C in FIG. 2B. In this state where $V_2>V_3>V_1$, the outputs of said comparing circuit 9 and 10 are both in the "L" state. The 'AND' gates 12 and 13 both are accordingly closed, and the shift counter 14 retains the state thereof since the pulses from the pulse generator 11 are not supplied thereto. Thus, even if there is a change in the output voltage $V_3$ of the light measuring circuit corresponding to the change in the light intensity coming into the photoconductive element 5, the shift counter 14 remains unchanged so long as the relationship $V_2>V_3>V_1$ stands, and the LED 21b is maintained in lighted state to indicate the light intensity at this state.

Assuming that the light intensity is increased from this state by 1EV so that the resistance $R_c$ of the photoconductive element 5 changes from $R_0/2$ to $R_0/2\sqrt{2}$, the output voltage $V_3$ of the light measuring circuit assumes a state D in FIG. 2B where it is again higher than the standard voltages $V_1$ and $V_2$. Accordingly, the comparing circuits 9 and 10 respectively generate outputs H and L to open the 'AND' gate 12 while the 'AND' gate 13 is maintained closed. Accordingly, a pulse from the pulse generator 11 is again entered to the input terminal $r$ of the shift counter 14, whereby the flip-flops 14a, 14b and 14c assume the state "H" thereby extinguishing the LED 21b, instead lighting the LED 21c and shifting the FET's 8a, 8b and 8c to "on" state. In this state the synthesized resistance R assumes a value $R_0/2\sqrt{2}$ to bring the output voltage $V_3$ of the light measuring circuit to a state represented by E in FIG. 2B, where the relation $V_2>V_3>V_1$ again stands. Thus the 'AND' gate 12 is closed to interrupt the pulses from the pulse generator 11.

In this state, therefore, the lighted LED is changed from 21b to 21c, corresponding to an increase of light intensity by 1 EV.

If it is assumed that the light intensity is decreased by 2 EV from this state, with corresponding change of the resistance $R_c$ of the photoconductive element 5 from $R_2/2\sqrt{2}$ to $R_0/\sqrt{2}$ as represented by F in FIG. 2B, where the output voltage $V_3$ of the light measuring circuit is lower than the standard voltages $V_1$ and $V_2$, the comparing circuits 9 and 10 generates respectively an output L and an output H, thus opening the 'AND' gate 13 while the 'AND' gate 12 is maintained closed. Thus a pulse from the pulse generator 11 is entered into the input terminal $l$ of the shift counter, with resulting shift of the output of flip-flop 14c from H to L, thereby extinguishing the LED 21c, instead lighting the LED 21b and shifting the FET 8c from "on" to "off" state. The synthesized resistance R therefore assumes a value $R_0/2$ to bring the output voltage $V_3$ to the state G in FIG. 2B. In this state, as said output voltage $V_3$ is still lower than the standard voltages $V_1$ and $V_2$, the same procedure as explained above is repeated to add an additional pulse to the input terminal $l$ of the shift counter 14 with the resulting shift of the flip-flop 14b from H to L, thereby extinguising the LED 21b, instead lighting the LED 21a and shifting the FET 8b from "on" to "off" state. Thus the output voltage $V_3$ of the light measuring circuit assumes the state H in FIG. 2B wherein the relation $V_2>V_3>V_1$ holds, with resulting change of the output of the comparing circuit 10 from H to L. The 'AND' gates 12 and 13 are both closed since the comparing circuit 9 remains in the "L" state, thereby retaining the shift counter 14 in the unchanged state thereof.

In this state, therefore, the LED 21a is lighted corresponding to the light intensity decreased by the 2 EV compared with the former state.

As will be understood from the foregoing, the LED's 20, 21a, 21b, 21c or 21d are lighted (activated) respectively when the resistance $R_c$ of the photoconductive element 5 is equal to $R_0$, $R_0/\sqrt{2}$, $R_0/2$, $R_0/2\sqrt{2}$ or $R_0/4$. The successive resistance values correspond to successive light intensities differing by 1 EV. Even when there is a change in the above-mentioned resistance of the photoconductive element 5, a same LED continues to be lighted so long as said changed output voltage $V_3$ is within a range represented by the relation $V_2>V_3>V_1$. This means that an LED corresponding to a determined intensity of incident light is lighted for all the light intensities within a range of $\pm\frac{1}{4}$ EV with respect to said determined intensity.

In the following explained is the case where the resistance $R_c$ of the photoconductive element 5 assumes an intermediate value located between said ranges. For example, there is assumed an increase in the light intensity by $\frac{1}{2}$ EV from a state of H in FIG. 2B where $R_c = R_0/\sqrt{2}$ with the bit 14a alone in the shift counter 14 being in "H" state, with the LED 21a in the lighted state, with FET 8a being in "on" state, and with the synthesized resistance R therefore being equal to $R_0/\sqrt{2}$. In this state, $V_3$ is represented by I in FIG. 2B. Since the $V_3$ is higher than $V_1$ and $V_2$, the comparing circuits 9 and 10 respectively generate output H and L thereby opening the 'AND' gate 12 and closing the 'AND' gate 13. Accordingly entry of the pulse from the pulse generator 11 to the input terminal $r$ of the shift counter 14 causes the shift of the flip-flops 14a and 14b to "H" state, thereby extinguishing the LED 21a, instead lighting 21b and causing the FET 8a and 8b to assume the "on" state. In this state the synthesized resistance R assumes a value $R_0/2$, with the resulting output voltage $V_3$ of the light measuring circuit being located at the level J in FIG. 2B which is lower than the standard voltages $V_1$ and $V_2$. Accordingly, the comparing circuits 9 and 10 respectively generate outputs L and H to open the 'AND' gate 13 and close the 'AND' gate 12. Thus the pulse from the pulse generator 11 is entered into the input terminal $l$ of the shift counter 14 to change the flip-flop 14b to "L" state, leaving the flip-flop 14a alone in the "H" state, thereby extinguishing the LED 21b, and instead lighting the LED 21a. Simultaneously the FET 8b is shifted to "off" state, with the FET 8a alone being left in "on" state, to change the sythesized resistance R to $R_0/\sqrt{2}$. In this state, the output voltage $V_3$ of the light measuring circuit represented by K in FIG. 2B is identical to the initial state I therein, and a same procedure is therefore repeated. The output voltage $V_3$ of the light measuring circuit assumes the state I and state J in FIG. 2B alternatively without satisfying the condition $V_2>V_3>V_1$. Thus the LED's 21a and 21b are alternately lighted, indicating that the intensity of incident light is located between a level corresponding to the LED 21a and that corresponding to the LED 21b. Furthermore, by selecting a sufficiently high frequency for the output pulses of the pulse generator 11, the LED's 21a and 21b appear to the observer as if both are lighted simultaneously since the period of alternate lighting of said LED's is accordingly shortened.

In the foregoing embodiment where the light measuring circuit is composed of a photoconductive element 5 and fixed resistors 6, 7a, 7b, 7c and 7d while the standard voltage circuit is composed of fixed resistors 2, 3 and 4, the output voltage $V_3$ of said light measuring circuit is changed according to the FET's controlled by the output of a counter and is compared with the output voltages of said standard voltage circuit thereby controlling the pulse counting by said counter. However it is also possible to change output voltages of said standard voltage circuit according to the output of said counter and to compare thus changed standard voltage with the output voltage of said light measuring circuit thereby controlling the pulse counting by said counter. In the following is an another embodiment wherein such principle is employed.

Referring to FIG. 3 showing an another embodiment of the present invention, the components corresponding to those in the embodiment of FIG. 1 are represented by the same numbers. In this embodiment, a constant current circuit is composed of diodes 101 and 105, fixed resistors 102, 103, 104 and 107, a operational amplifier 106 and a transistor 108. The constant current curcuit supplies an electric current of a temperature characteristics proportional to the absolute temperature as the emitter current of said transistor 108. Variable resistors 109 and 110 of which values are varied respectively according to the sensitivity of the film used and the lens aperture are connected in series to the emitter circuit of said transistor 108 thereby changing the potential at the connecting point between said transistor 108 and said variable resistor 109 according to the sensitivity of film and the aperture of lens. A logarithmic converting circuit for the light intensity is composed of a diode 111, a photodiode 112 and a operational amplifier 113, to generate a voltage proportional to the logarithm of the light intensity.

According to the composition shown in FIG. 3 where the emitter voltage of said transistor 108 is supplied to the cathode of said diode 111, the output voltage $V_{13}$ of said operational amplifier 113 corresponds to the logarithm of the light intensity, with the information on the film sensitivity and lens aperture inclusive, and can be made, by suitable selection of parameters, proportional to the logarithm of the exposure time giving proper exposure on the film. A light measuring circuit is composed of the above-mentioned components 101 to 113. Also an another constant current circuit similar to that composed of 101 to 108 is composed of diodes 114 and 118, fixed resistors 115, 116, 117 and 120, a operational amplifier 119 and a transistor 121, and likewise supplies an electric current of a temperature characteristics proportional to absolute temperature as the emitter current of said transistor 121. There are connected, between the emitter of said transistor 121 and the negative terminal of power source 1, a fixed resistor 122, a diode 123, and fixed resistors 124, 125a, 125b, 125c and 125d in series. The value of said fixed resistor 122 is selected so as to generate a voltage drop between the ends thereof corresponding to ½ EV, which is approximately equal to 18mV at normal temperature in case two silicon diodes are used in the forward direction for said logarithmic converting diode 111. Also the fixed resistors 125a, 125b, 125c and 125d are mutually same in resistance and selected so as to cause a voltage drop respectively corresponding to 1 EV, or appoximately 36 mV at normal temperature in the foregoing example. Stated differently the resistance of 125a, 125b, 125c and 125d is approximately twice of that of 122. Said diode 123 is provided in order to obtain the same temperature characteristics as those of said diode 111, and said fixed resistor 124 is provided in order to maintain the voltages of said light measuring circuit and that of standard voltage circuit at a same level. Said standard voltage circuit is composed of said components 114 to 125d.

An input terminal 9b of a comparing circuit 9 and an input terminal 10b of an another comparing circuit 10 are connected with the output terminal of said operational amplifier 113 which is the output terminal of said light measuring circuit, while the other input terminal 9a of said comparing circuit is connected with the connecting point between said transistor 121 and said fixed resistor 122 and the other input terminal 10a of said comparing circuit 10 is connected with the connecting point between said fixed resistor 122 and said diode 123. There is provided an 'OR' gate 25 of which two input terminals are respectively connected with the output terminal 9c of said comparing circuit 9 and the output terminal 10c of said comparing circuit 10 so that said 'OR' gate 25 provides an output voltage level H when at least one of the outputs from said terminals 9c and 10c of the comparing circuits 9 and 10 assumes a level H. In the present embodiment, the output voltages of two comparing circuits cannot assume the level H at the same time. Further there is provided an 'AND' gate 26 of which two input terminals are respectively connected with the pulse generator 11 and the output terminal of said 'OR' gate 25 to allow entry of the pulses from said pulse generator 11 to one of the input terminals of the shift counter 14 when said 'OR' gate generates an output voltage H and to interrupt said entry of the pulses in other cases. A mode terminal M of the shift counter 14 is connected with the output terminal 10c of said comparing circuit 10 and functions to shift the contents of the shift counter 14 to the left corresponding to the number of pulses supplied from the generator 11 to the input terminal of the shift counter 14 when the voltage level at the terminal 10c is H, and to shift the content of the shift counter 14 to the right corresponding to said number of pulses when said voltage level at the terminal 10c is L. Thus speaking solely of the state of shift counter 14 in response to the outputs of said comparing circuits 9 and 10, the function of the circuit in this embodiment is completely identical to that in the foregoing embodiment. In this manner a reversible counter means is composed of said 'OR' gate 25, an 'AND' gate 26 and a shift counter 14.

The FET's 126a, 126b, 126c and 126d which correspond to the FET's 8a, 8b, 8c and 8d in the foregoing embodiment but of which gates are connected respectively with the bits 14a, 14b, 14c and 14d of the shift counter 14 through inverters 127a, 127b, 127c and 127d function in an opposite manner compared with the foregoing embodiment, so as that each FET shifts to nonconductive, namely, "off" state when the corresponding bit of the shift counter 14 assumes a state "H". For example the FET 126a is shifted to "off" state when the flip-flop 14a is shifted to "H" state. Said FET's 126a, 126b, 126c and 126d are connected on one terminals thereof to the negative terminal of the power source 1 and on the other terminals thereof respectively with the connecting point between the fixed resistors 124 and 125a, the connecting point between the fixed resistors 125a and 125b, the connecting point between the fixed resistors 125b and 125c, and the connecting point between the fixed resistor 125c and 125d. The rest of the circuit is structured same as in the embodiment of FIG. 1.

It is now assumed that the potential at the connecting point between the emitter of said transistor 121 and said fixed resistor 122 is $V_{12}$ and that at the connecting point between said fixed resistor 122 and said diode 123 is $V_{11}$, and that $V_0$ stands for an arithmetic means of $V_{11}$ and $V_{12}$ for an initial state where all the bits of shift counter 14 are in "L" state, i.e. all the FET's 126a, 126b, 126c and 126d are in "on" state, and $\Delta V$ stands for the voltage change corresponding to 1 EV in the output of the logarithmic converting circuit. Thus:

$$V_{12} = V_0 + \tfrac{1}{2}\Delta V$$

$$V_{11} = V_0 - \tfrac{1}{2}\Delta V$$

Figure 4:
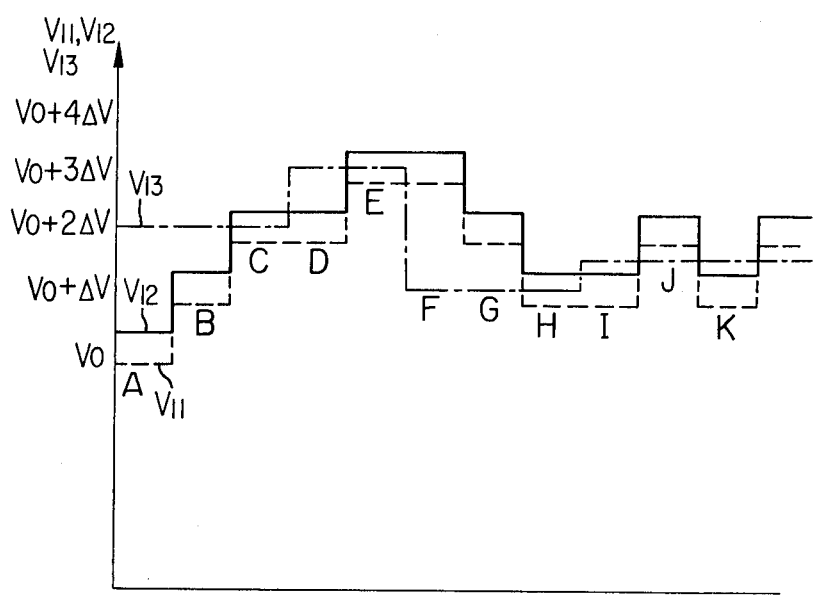
FIG. 4 shows the behavior of voltages in the second embodiment shown in FIG. 3.

The function of the embodiment of FIG. 3 is graphically shown in FIG. 4, wherein the behaviors of $V_{11}$, $V_{12}$ and $V_{13}$ are respectively represented by a broken line, a full line and a dash-dot line against time in abscissa.

It is assumed in this case that, after setting of the sensitivity of film used and the aperture of lens, the output voltage $V_{13}$ of the light measuring circuit is equal to $V_0 + 2\Delta V$ in response to the incident light to the photodiode 112. As said voltage is higher than the standard voltages $V_{11}$ and $V_{12}$, the comparing circuits 9 and 10 respectively generate an output H and an output L to apply a signal L to the mode terminal M of the shift counter 14 thereby instructing the pulse counting to the right. Thus the 'OR' gate 25 is opened and the 'AND' gate 26 transmits the pulses from the pulse generator 11 to the input terminal of the shift counter 14. The first pulse shifts the flip-flop 14a to a "H" state thereby lighting the LED 21a and shifting the FET 126a to "off" state. Thus a voltage $\Delta V$ between the ends of fixed resistor 125a thus far shortcircuited by the FET 126a becomes added to the standard voltages $V_{11}$ and $V_{12}$ thereby changing said voltages from the state A to state B in FIG. 4. As there is not change in the condition of the comparing circuit 9 and 10, the shaft counter continues counting of pulses whereby the flip-flop 14b assumes a "H" state to extinguish the LED 21a, to light the LED 21b instead and to shift the FET 126b to "off" state. Thus a voltage $\Delta V$ across the fixed resistor 125b further becomes added to the standard voltage $V_{11}$ and $V_{12}$ to achieve the state C in FIG. 4. As the relation $V_{12} > V_{13} > V_{11}$ stands in this state, the comparing circuits 9 and 10 both assume "L" output state to close the 'OR' gate 25. The pulses from the pulse generator 11 are not supplied to the shift counter 14, and the LED 21b is maintained in the lighted state. Supposing that the output voltage $V_{13}$ of the light measuring circuit is increased by 1 EV to reach $V_0 + 3\Delta V$ as shown by D in FIG. 4 corresponding to a change in the light intensity, film sensitivity or lens aperture, one pulse is added to the input terminal of the shift counter 14 to reach the state E wherein the LED 21c is lighted. Also when the output voltage $V_{13}$ of the light measuring circuit is decreased by 2 EV to reach $V_0 + \Delta V$ as shown by the state F in FIG. 4, a signal H is supplied from the comparing circuit 10 to the mode terminal M of the shift counter 14 thus instructing a pulse counting to the left. In this manner two pulses are supplied from the pulse generator 11 to reach a state H wherein the LED 21a is lighted. The state I thereafter show the case where the output voltage $V_{13}$ of the light measuring circuit is increased by $\tfrac{1}{2}$ EV. In this case, the state I and state J are alternately repeated as explained in the foregoing embodiment, with resulting alternate lighting of LED's 21a and 21b.

As will be understood from the foregoing, the embodiment of FIG. 3 is designed to indicate an optimum shutter speed by lighting corresponding LED's according to the intensity of incident light to the photodiode 112, and the setting of film sensitivity and lens aperture, and is thus applicable for the indication in an automatic exposure-controlled camera utilizing an electrically controlled shutter. Also in this case, as in the first embodiment, an LED corresponding to a determined shutter speed is lighted when the $V_{13}$ is located within a range of $\pm \tfrac{1}{4}$ EV with respect to said determined shutter speed, and two adjoining LED's are alternately lighted if said $V_{13}$ is located between such ranges.

Figure 5:
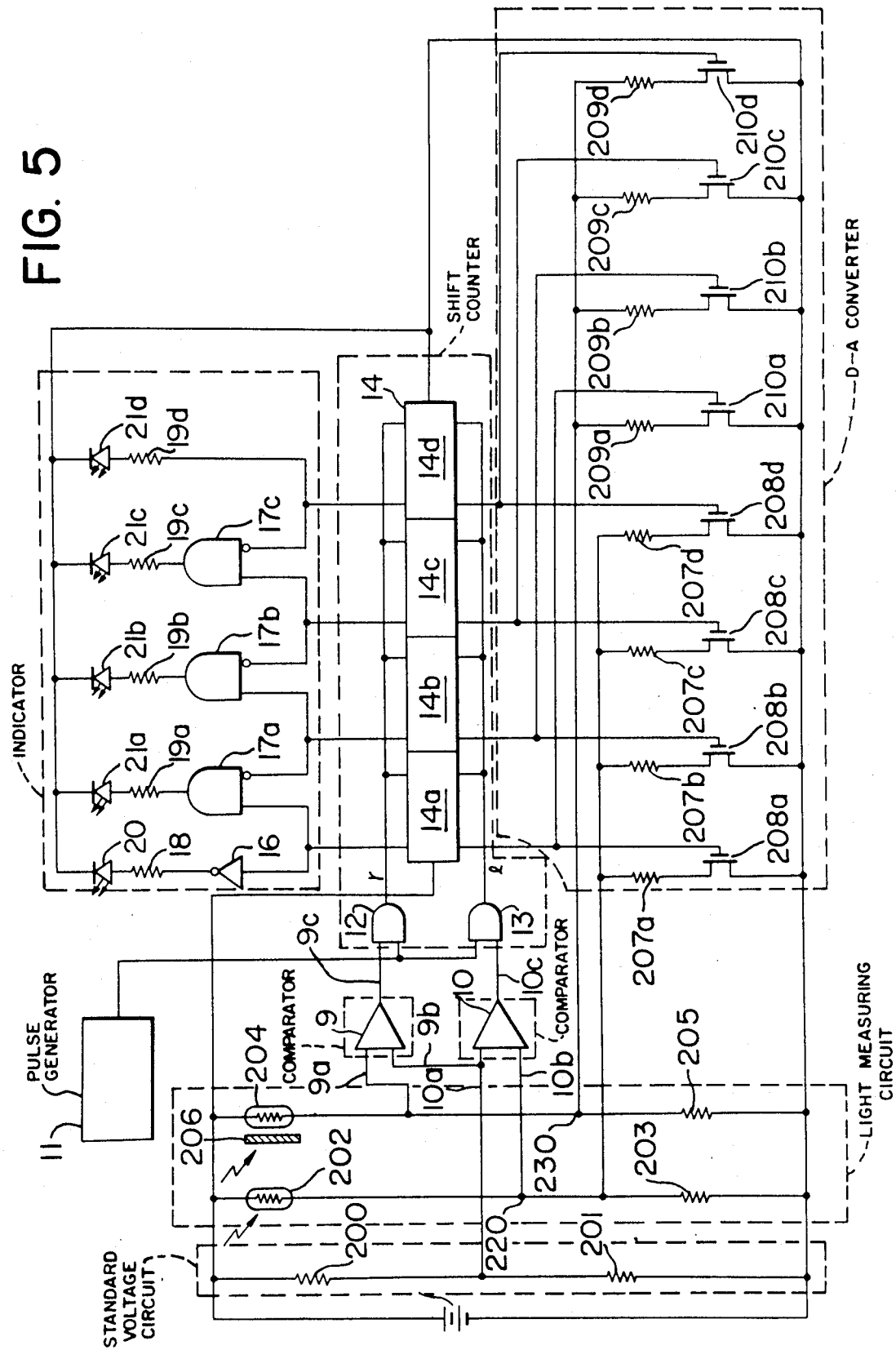
FIG. 5 is a circuit drawing of a third embodiment of the present invention.

In the foregoing two embodiments the standard voltage circuit is provided with two outputs of a difference of $\tfrac{1}{2}$ EV respectively supplied to two comparing circuits in order to obtain two different inverting levels therein, but the same purpose can be achieved, as in the third embodiment of the present invention shown in FIG. 5, by providing the light measuring circuit with two photoelectric elements generating two outputs which are mutually different by $\tfrac{1}{2}$ EV for the same light intensity and by using said outputs for obtaining the difference of inverting levels in two comparing circuits.

Referring to FIG. 5, a standard voltage circuit is composed of resistors 200 and 201 connected in series, the connecting point therebetween being the output terminal. A photoelectric element 202 connected in series with a resistor 203 and a photoelectric element 204 connected in series with a resistor 205 are respectively connected with the power source 1. Both said photoelectric elements receive same light but generate two outputs mutually different by $\tfrac{1}{2}$ EV due to a filter 206 placed in front of said photoelectric element 204.

There are provided two comparing circuits 9 and 10 of which one input terminals 9b and 10a are both connected with the output terminal of the standard voltage circuit 200/201 while the other input terminals 9a and 10b are respectively connected with two output terminals 220 and 230 of the light measuring circuit consisting of 202, 203, 204 and 205. Also four series-connected pairs of resistors and FET's 207a, and 208a, 207b and 208b, 207c, and 208c, and 207d and 208d are connected in parallel with said resistor 203, while other four series-connected pairs of resistors and FET's 209a and 210a, 209b and 210b, 209c, and 210c, and 209d and 210d, are connected in parallel with said resistor 205, thereby to change the voltages of the two output terminals 220 and 230 of the light measuring circuit according to the output of counter.

The rest of the circuit is similar to the foregoing embodiments, and the explanation of the function is omitted as it is similar to the foregoing explanation.

As represented by the foregoing three embodiments, the light measuring and indicating circuit of the present invention is structured in such a manner that the difference of levels causing the inversion of the outputs of comparing circuits is selected smaller than the change of the output signal from the light measuring circuit or the standard voltage circuit corresponding to one step in the digital-analog converting circuit, thereby lighting an indicating element in case the information relating to the light intensity is located at predetermined levels or within predetermined ranges around said predetermined levels, and lighting two neighboring indicating elements alternately in case said information is located in an intermediate level.

Through in the foregoing embodiments the difference between the inverting levels of the comparing circuits is selected to be equal to ½ EV and the difference of output signals of the digital-analog converting circuit corresponding to one pulse is selected to be equal to 1 EV thus to light an indicating element for each EV level while two adjacent indicating elements being lighted alternately at intermediate levels, thereby enabling an indication of every ½ EV levels, it is also possible, for example, to employ 1 EV for the difference of inverting levels and 2 EV for the difference of output signals corresponding to one pulse. Further, the difference of inverting levels need not necessarily be equal to a half of the difference of the output signals for one pulse, and the above-mentioned effect can be obtained so long as said difference of inverting levels is smaller than the difference of output signals for one pulse.

In the foregoing embodiments there is employed a shift counter consisting of a right-left shift register of 4 bits for the purpose of clarity, but it is naturally possible to use larger or smaller numbers of bits if desirable. Also any reversible counter, for example, a binary up-down counter provided with a suitable decoder, can be employed satisfactorily in the present invention.

As thus for detailedly explained, the present invention enables, in a light measuring and indicating device utilizing indicating elements such as light-emitting diodes, to significantly reduce the number of flip-flops necessary for the indication. For example, in case of indicating 9 levels with 5 indicating elements as in the foregoing embodiments, the conventional device utilizing a shift counter requires at least 8 flip-flops whereas only 4 flip-flops are required according to the present invention. In case of the use of a binary counter, the present invention theoretically enables to reduce only one flip-flop, but on the other hand enables to reduce significantly the number of gates employed in the decoder attached to said binary counter. Furthermore, according to the present invention, a light intensity falling between the predetermined levels is indicated by alternate lighting of two adjacent indicating elements, and such alternate lighting will appear to the observer as if two indicating elements are lighted simultaneously by employing a sufficiently short alternating period as already explained in the foregoing. However, if desirable, it will be easily achieved to let the observer know that the light intensity is located at an intermediate level by employed an alternating period long enough for the observer to ascertain the intermittent lighting of said indicating elements.

I claim:

1. A light measuring and indicating circuit comprising means for producing three signals, the value of one of which varies relative to the values of the others in accordance with light intensity, comparator means for producing a first output when said one signal has a value less than the values of the other signals and for producing a second output when said one signal has a value greater than the values of said other signals, reversible counter means, means for operating said counter means in one direction in response to said first output, means for operating said counter means in the opposite direction in response to said second output, indicator means responsive to an output from said counter means, and means for controlling the value of said one signal relative to the values of the other signals in response to an output from said counter means.

2. A light measuring and indicating circuit in accordance with claim 1, wherein said counter means comprises a digital counter having a plurality of stages, wherein said indicator means has a plurality of indicator elements controlled by said stages, and wherein said controlling means comprises digital-to-analog converter means.

3. A light measuring and indicating circuit in accordance with claim 2, wherein said comparator means comprises a pair of comparators, one of which compares said one signal with a second of said signals and the other of which compares said one signal with a third of said signals, wherein said second and third signals differ in value by a predetermined amount, and wherein said digital-to-analog converter means varies the value of said one signal relative to the values of said second and third signals in steps differing in value by an amount greater than said predetermined amount.

4. A light measuring and indicating circuit in accordance with claim 3, wherein said indicator means produces predetermined indications for the counts of said counter means corresponding to predetermined light intensities and alternates between successive predetermined indications for intermediate levels of light intensity.

5. A light measuring and indicating circuit including indicator means having a plurality of indicator elements, and comprising means for activating different indicator elements in response to corresponding predetermined light intensity levels and for activating indicator elements alternately when the light intensity is intermediate the levels corresponding to those indicator elements, said activating means comprising a reversible digital counter having successive stages for controlling the activation of said indicator elements.

6. A light measuring and indicating circuit in accordance with claim 5, wherein each of said predetermined light intensity levels has a predetermined associated intensity range within which a corresponding indicator element is activated, the ranges associated with successive intensity levels being separated so that successive indicator elements are activated alternately when the light intensity is between such ranges.

7. A light measuring and indicating circuit in accordance with claim 5, wherein said indicator elements are lights and wherein said activating means causes said alternate activation of indicator elements with a period of alternation short enough so that the alternately activated indicator elements appear to the human eye to be activated simultaneously.

8. A light measuring and indicating circuit in accordance with claim 5, wherein said activating means comprises comparator means responsive to light-dependent and standard signals for determining whether said counter counts in one direction, counts in the opposite direction, or remains unchanged.

9. A light measuring and indicating circuit in accordance with claim 8, wherein said activating means further comprises digital-to-analog converter means for producing an analog output from said counter, said analog output varying said light-dependent or said standard signals.

10. A light measuring and indicating circuit in accordance with claim 9, wherein said light-dependent signal is produced by a light-measuring circuit having an output that is varied in accordance with said analog output from said counter.

11. A light measuring and indicating circuit in accordance with claim 9, wherein said standard signal is produced by a standard voltage circuit having an output that is varied in accordance with said analog output from said counter.

12. A light measuring and indicating circuit in accordance with claim 9, wherein said comparator means comprises a pair of comparators, each for comparing a light-dependent signal with a standard signal.

13. A light measuring and indicating circuit in accordance with claim 12, wherein said comparators are responsive, respectively, to two standard signals differing in value by a predetermined amount and to a single light-dependent signal.

14. A light measuring and indicating circuit in accordance with claim 12, wherein said comparators are responsive, respectively, to two light-dependent signals differing in value by a predetermined amount and to a single standard signal.

15. A light measuring and indicating circuit in accordance with claim 12, wherein said comparators are responsive, respectively, to first and second signals which differ in value by a predetermined amount and wherein both comparators are responsive to a third signal, one of said comparators producing an output when said third signal has a value greater than the values of said first and second signals, the other of said comparators producing an output when said third signal has a value less than the values of said first and second signals, and neither comparator producing an output when the value of said third signal is between the values of said first and second signals, said outputs from said comparators causing said counter to count in one direction or the opposite direction, respectively, said analog output from said counter varying in steps, with the difference between the values of successive steps being a predetermined amount greater than the difference between the values of said first and second signals, and means for varying the values of said first and second signals relative to the value of said third signal in accordance with said analog output from said counter.

16. A light measuring and indicating circuit in accordance with claim 15, wherein said first and second signals are standard signals produced by a standard voltage circuit at opposite ends of an impedance, and wherein said digital-to-analog converter means comprises a plurality of impedances selectively connected in series with the first mentioned impedance under the control of the stages of said counter.

17. A light measuring and indicating circuit in accordance with claim 15, wherein said first and second signals are light-dependent signals produced by a pair of light measuring circuits each including an impedance, and wherein said digital-to-analog converter means comprises a plurality of impedances selectively placed in parallel with the first-mentioned impedances under the control of the stages of said counter.

18. A light measuring and indicating circuit in accordance with claim 17, wherein said third signal is a standard signal.

19. A light measuring and indicating circuit in accordance with claim 15, wherein said activating means further comprises pulse generator means and gate means for passing pulses from said generator means to said counter to be counted, and wherein said gate means is responsive to the output from at least one of said comparators.

20. A light measuring and indicating circuit in accordance with claim 15, wherein said third signal is a light-dependent signal produced by a light measuring circuit including an impedance, and wherein said digital-to-analog converter means comprises a plurality of impedances selectively placed in parallel with the first-mentioned impedance under the control of the stages of said counter.

21. A light measuring and indicating circuit in accordance with claim 20, wherein said first and second signals are standard signals.

* * * * *